(12) United States Patent
Yao et al.

(10) Patent No.: US 12,055,159 B2
(45) Date of Patent: Aug. 6, 2024

(54) FAN GUARD (71) Applicant: ZT Group Int'l, Inc., Secaucus, NJ (US)

(72) Inventors: Cong Yao, Nutley, NJ (US); Darell Sutton, Secaucus, NJ (US); Richard Gaugler, Fair Lawn, NJ (US)

(73) Assignee: ZT GROUP INT'L, INC., Secaucus, NJ (US)

( * ) Notice: Subject to any disclaimer, the term of this patent is extended or adjusted under 35 U.S.C. 154(b) by 0 days.

(21) Appl. No.: 17/935,181

(22) Filed: Sep. 26, 2022

(65) Prior Publication Data
US 2024/0102492 A1 Mar. 28, 2024

(51) Int. Cl.
F04D 29/70 (2006.01)
F04D 19/00 (2006.01)
F04D 29/52 (2006.01)
H05K 7/20 (2006.01)

(52) U.S. Cl.
CPC ......... F04D 29/703 (2013.01); F04D 19/002 (2013.01); F04D 29/522 (2013.01); H05K 7/20145 (2013.01)

(58) Field of Classification Search
CPC .. F04D 29/544; F04D 25/0613; F04D 29/601; F04D 19/007; F04D 29/542; F04D 29/668; F04D 29/703; F04D 19/002; F04D 25/166; F04D 29/181; F04D 29/38; F04D 29/386; F04D 29/522; F01D 5/141; H05K 7/20145
See application file for complete search history.

(56) References Cited

U.S. PATENT DOCUMENTS

| | | | | | |
|---|---|---|---|---|---|
| 2,154,313 | A | * | 4/1939 | McMahan | F04D 29/541 415/181 |
| 6,045,327 | A | * | 4/2000 | Amr | F04D 25/08 416/189 |
| 6,799,942 | B1 | * | 10/2004 | Tzeng | F04D 29/542 415/209.1 |
| 9,506,375 | B2 | * | 11/2016 | Cachia | F01D 25/243 |
| 10,876,545 | B2 | * | 12/2020 | Ediger | F04D 19/002 |
| 11,280,352 | B2 | * | 3/2022 | Zhang | F04D 29/544 |
| 2009/0246017 | A1 | * | 10/2009 | Lee | F04D 29/542 415/220 |
| 2013/0097558 | A1 | * | 4/2013 | Lichtenstein | G06F 21/10 715/810 |
| 2014/0023495 | A1 | * | 1/2014 | Huang | F04D 19/002 415/220 |
| 2016/0108929 | A1 | * | 4/2016 | Su | F04D 29/544 415/177 |

* cited by examiner

Primary Examiner — Eric J Zamora Alvarez
(74) Attorney, Agent, or Firm — POLSINELLI PC (57) ABSTRACT A fan guard includes a guard housing and a plurality of guard blades. The guard housing includes an outer tunnel wall forming a housing aperture to permit air to flow across the guard housing. The guard blades are disposed in the housing aperture. Each of the guard blades extend from the guard housing towards a center of the housing aperture. Each guard blade at least partially overlaps an adjacent guard blade. Each of the guard blades are droplet shaped.

18 Claims, 12 Drawing Sheets

| | \multicolumn{7}{c}{Fan Speed} | | | | | | |
|---|---|---|---|---|---|---|---|
| | 30 | 50 | 60 | 70 | 80 | 90 | 100 |
| Slot 1 | 100% | 99.6% | 99.6% | 100% | 100% | 100% | 99.6% |
| Slot 2 | 100% | 99.6% | 99.6% | 99.6% | 99.6% | 99.3% | 82.5% |
| Slot 3 | 100% | 100% | 100% | 99.6% | 99.6% | 90.7% | 43.3% |

| | \multicolumn{7}{c}{Fan Speed} | | | | | | |
|---|---|---|---|---|---|---|---|
| | 30 | 50 | 60 | 70 | 80 | 90 | 100 |
| Slot 1 | 100% | 99.6% | 100% | 99.6% | 99.6% | 96.6% | 96.3% |
| Slot 2 | 100% | 99.6% | 100% | 100% | 100% | 100% | 99.6% |
| Slot 3 | 100% | 99.3% | 99.6% | 98.1% | 99.3% | 99.3% | 97.4% |

FIG. 6B

| 700 | | | | | | | | | | |
|---|---|---|---|---|---|---|---|---|---|---|
| | | | | 4U HDDs(°C) | | | | | | |
| Baseline @ 45°C | 50 | 53 | 56 | 57 | 57 | 59 | 57 | 56 |
| | 50 | 53 | 56 | 57 | 58 | 59 | 57 | 56 |
| | 50 | 53 | 55 | 56 | 55 | 57 | 56 | 55 |
| Fan Gaurd @ 45°C | 50 | 54 | 56 | 56 | 57 | 58 | 57 | 56 |
| | 50 | 54 | 56 | 58 | 58 | 59 | 57 | 57 |
| | 50 | 54 | 56 | 57 | 56 | 57 | 56 | 56 |

FIG. 7

FIG. 8

FAN GUARD

FIELD

The present disclosure relates generally to a fan guard operable to be installed in a computing system.

BACKGROUND

Computing systems such as modular servers and/or information handling systems, can suffer from degradation issues due to high power, noise, and revolutions per minute from conventional fans. The internal hard drive(s) must remain under 60 degrees Celsius to avoid malfunction and damage. Accordingly, the fan system is critical to maintain the temperature of the hard drive(s) and minimize the power consumption of the computing system.

BRIEF DESCRIPTION OF THE DRAWINGS

Implementations of the present technology will now be described, by way of example only, with reference to the attached figures, wherein.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented. The term "coupled" is defined as connected, whether directly or indirectly through intervening components, and is not necessarily limited to physical connections. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "about" means reasonably close to the particular value. For example, about does not require the exact measurement specified and can be reasonably close. As used herein, the word "about" can include the exact number. The term "near" as used herein is within a short distance from the particular mentioned object. The term "near" can include abutting as well as relatively small distance beyond abutting. The terms "comprising," "including" and "having" are used interchangeably in this disclosure. The terms "comprising," "including" and "having" mean to include, but not necessarily be limited to the things so described.

Disclosed herein is a fan guard for a computing system such as a modular server and/or information handling system. The fan guard includes a plurality of guard blades extending from a guard housing towards a center of the fan guard. In at least one example, the guard blades can extend from an outer tunnel wall towards a hollow ring located in the center of the housing aperture. The guard blades can be droplet shaped. For example, the guard blades can be designed with a sigmoid curve and flexed or twisted horizontally to reduce bypassed air turbulence in order to block acoustic noise from the fan systems and reduce and/or attenuate airborne acoustic noise. The guard blades can at least partially overlap an adjacent guard blade to reduce or block acoustic noise from the fan systems.

With the fan guard, acoustic noise from the fan system is dampened and/or attenuated and airborne turbulence and airborne acoustic noise is reduced while the speed of the fan can be increased. With the fan guard, using higher rotations per minute of the fan system does not degrade hard drives, as conventional fan systems may have done. Accordingly, temperature and performance for components of the computing system such as hard drives are effectively managed within desired thresholds.

Figure 1A:
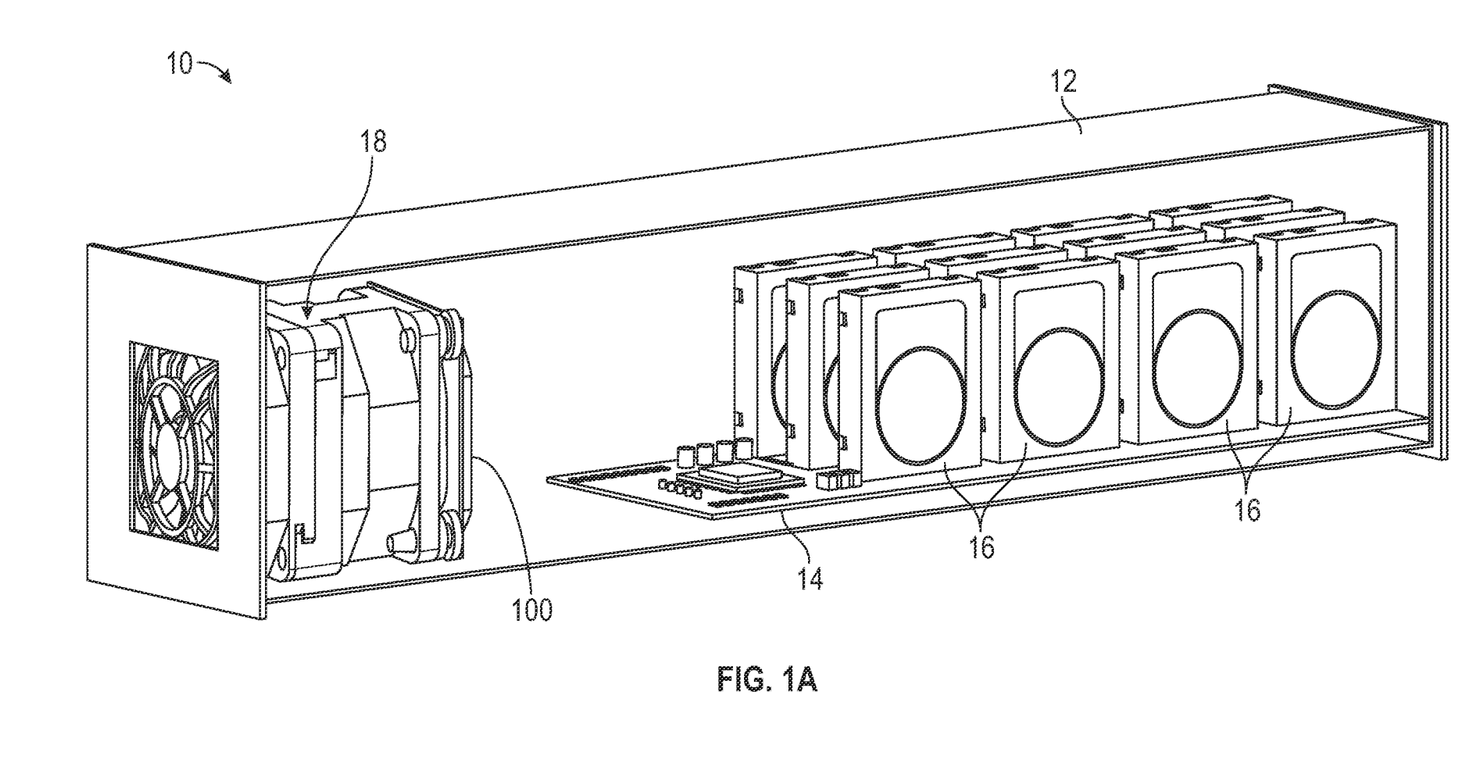
FIG. 1A is a perspective view of a computing system with a fan system having a fan guard.
Figure 1B:
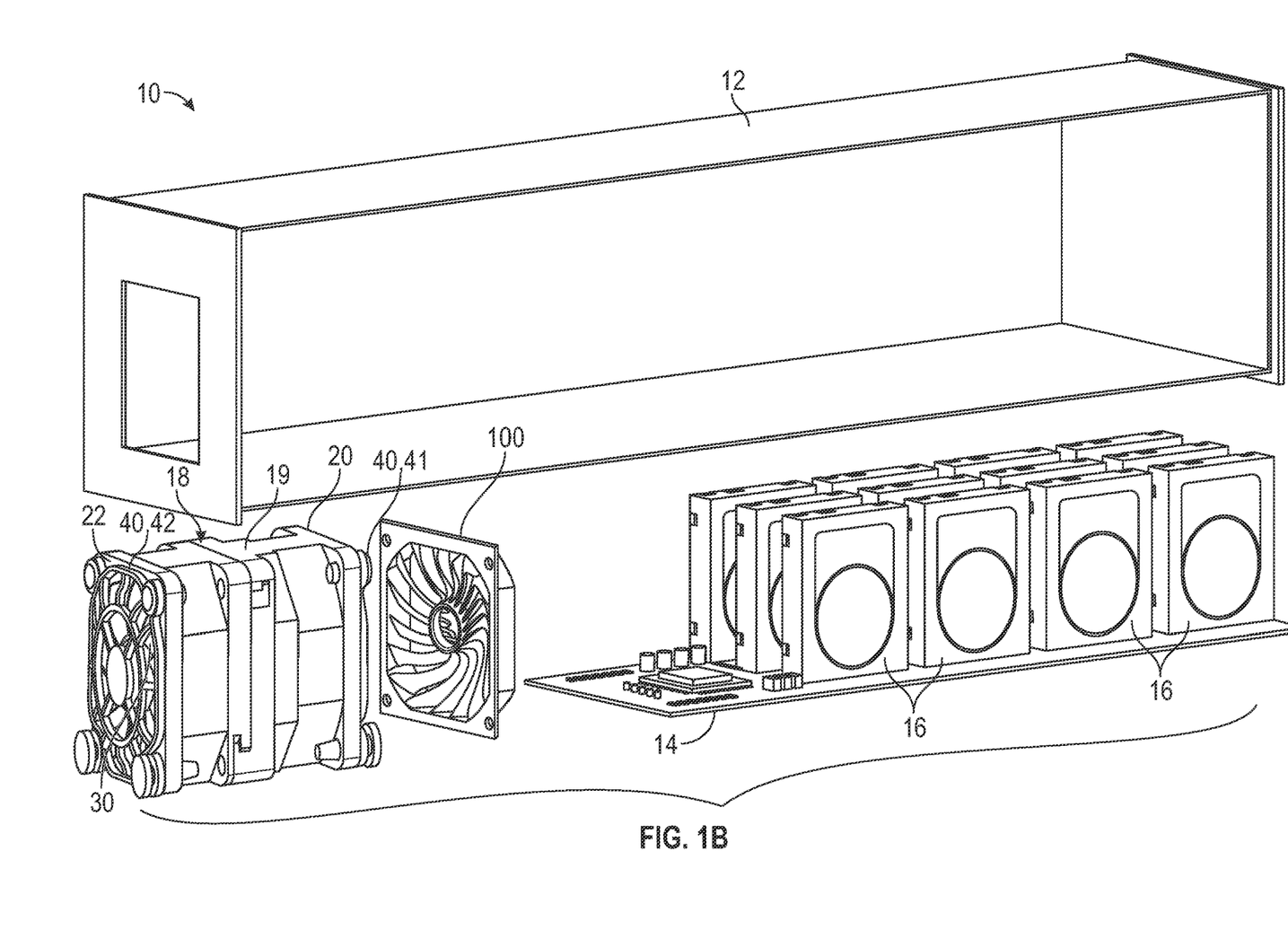
FIG. 1B is an exploded view of the computing system of FIG. 1A.

The disclosure now turns to FIGS. 1A and 1B, which illustrate an example of a computing system 10 to be used, for example, in a modular server and/or information handling system. The computing system 10 can include a body 12 operable to contain a plurality of components such as any combination of one or more motherboards 14, one or more hard drives 16, and one or more fan systems 18. Additional components can be disposed within the body 12 without deviating from the scope of the disclosure. As illustrated in FIGS. 1A and 1B, the computing system 10 can include a plurality of hard drives 16 disposed within the body 12. The hard drives 16 can be arranged in a series and/or an array. The hard drive(s) 16 can be coupled with the motherboard 14.

To manage the temperature and air flow within the body 12 of the computing system 10, one or more fan systems 18 can be provided. The fan systems 18 can be in communication with air inside and outside of the body 12. For example, the fan systems 18 can create air flow within the body 12 to assist in cooling down the components (e.g., the hard drive(s) 16) within the body 12. In some examples, one or more of the fan systems 18 can exhaust air from within the body 12 to external the body 12. The air within the body 12 is pulled from the front of the body 12 to the back of the body 12 and out of the body 12 via the fan system(s) 18. Accordingly, the air with a higher temperature after interacting with the components within the body 12 may be exhausted out of the body 12 such that the overall temperature within the body 12 can be decreased. In some examples, one or more fan systems 18 can pull air from external the body 12 to within the body 12. As the air outside of the body 12 may have a cooler temperature than the components within the body 12, the temperatures of the components within the body 12 can be managed to avoid failure or complications.

Each of the fan systems 18 can include a plurality of fan blades 30 operable to rotate to create air flow through the body 12 of the computing system 10. In some examples as illustrated in FIGS. 1A and 1B, the fan systems 18 can include a housing 19. The fan blades 30 can be disposed in the housing 19. The housing 19 of the fan systems 18 can include a first side 20 and a second side 22 opposite the first side. As illustrated in FIG. 1B, the housing 19 can be arranged such that the first side 20 is facing the interior of the body 12 (e.g., proximate the hard drives 16) of the computing system 10, and the second side 22 can be facing the exterior of the body 12 or away from the hard drives 16. In at least one example, the fan systems 18 may be positioned close to the hard drives 16. In some examples, the available space between the hard drive 16 closest to the fan system 18 and the fan system 18 may be less than 15 millimeters. Accordingly, the fan system 18 must efficiently move air within the body 12 of the computing system 10 to be able to adequately manage the temperatures of the hard drives 16. As illustrated in FIGS. 1A and 1B, the hard drives 16 can be positioned in a row and/or an array with each hard drive 16 positioned substantially perpendicular to the fan system(s) 18. Accordingly, the air flow created by the fan system(s) 18 can flow across a greater surface area across each of the hard drives 16 to better cool off the hard drives 16.

In at least one example, one or more finger guards 40 can be provided to prevent items such as fingers from interacting with the fan blades 30. Accordingly, the finger guards 40 can assist in preventing damage to the fan blades 30 as well as preventing damage to other items such as fingers. As illustrated in FIG. 1B, a first finger guard 41 can be coupled with the housing 19 on the first side 20, and the second finger guard 42 can be coupled with the housing 19 on the second side 22. In some examples, the fan systems 18 may not include either the first finger guard 41 and/or the second finger guard 42. In some examples, the fan systems 18 may not include a housing 19 such that the fan blades 30 are exposed within the body 12 of the computing system 10.

Figure 1C:
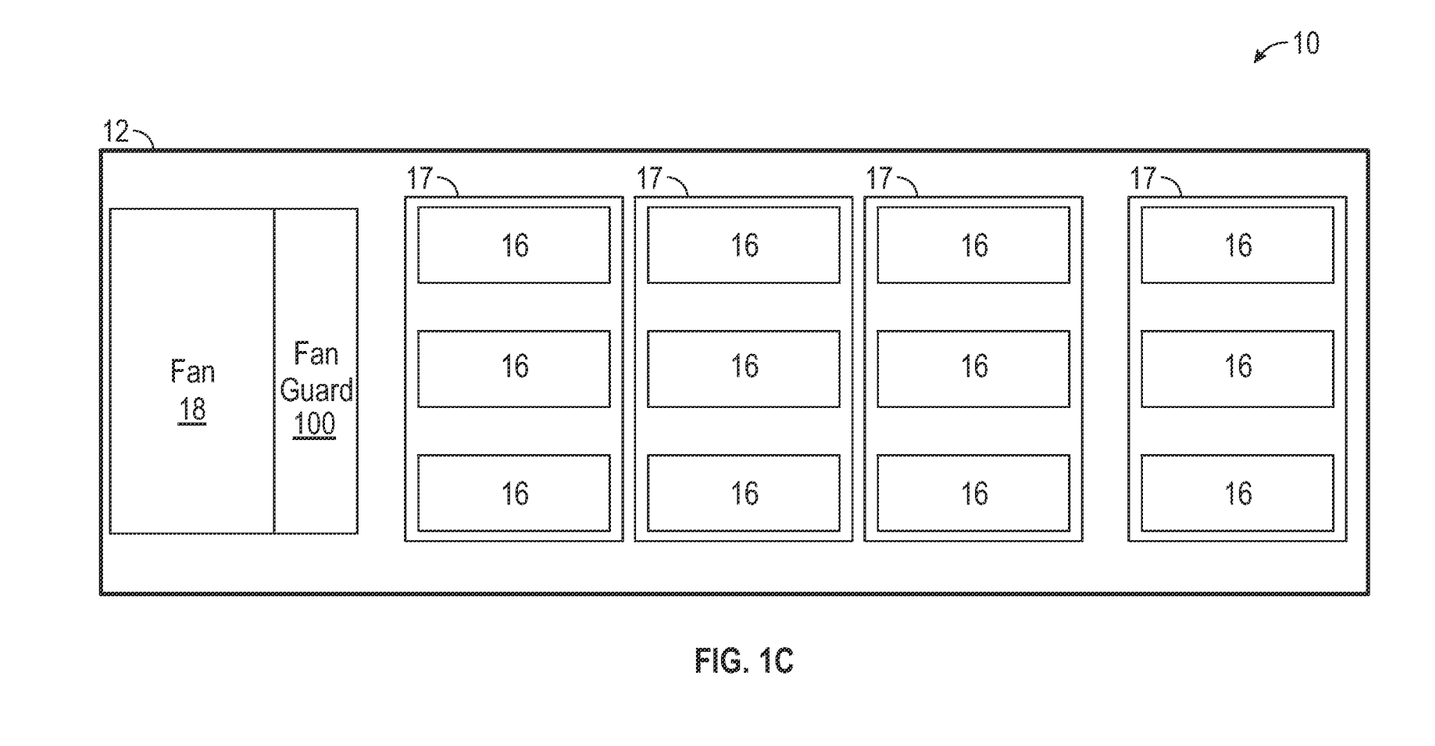
FIG. 1C is a diagrammatic view of the computing system of FIG. 1A.

As the fan systems 18 create air flow to decrease and/or maintain the temperature for the components (e.g., hard drive(s) 16) within the body 12 of the computing system 10, the fan systems 18 may require high amounts of power and create noise. The high power, high noise, and high rotations per minute of the fan systems 18 can create degradation issues, especially for the rows of hard drives 16 closest to the fan system 18. FIG. 1C illustrates a diagram of the computing system 10. As illustrated in FIG. 1C, the hard drives 16 can be positioned in rows 17. In at least one example, the computing system 10 can have one row 17 of hard drive(s) 16. In some examples, the computing system 10 can have more than one row 17 (e.g., two, three, four, five, six, seven, eight, or more rows 17) of hard drive(s) 16. In some examples, the second to last row 17 of hard drives 16 (e.g., second row 17 of hard drives 16 closest to the fan system 18) and/or the last row 17 (e.g., row 17 of hard drives 16 closest to the fan system 18) can have degradation issues as these rows 17 are closest to the fan system(s) 18. As the rows 17 of hard drive(s) 16 get further away from the fan system(s) 18, there is less impact to little to no impact from the fan system(s) 18.

To improve efficiency, reduce noise and reduce damage for the computing system 10, the computing system 10 can further include a fan guard 100 corresponding with each of the fan systems 18. In at least one example, the fan guard 100 can be coupled to the first side 20 of the fan system 18. The fan guard 100 can be positioned between the fan system 18 and the hard drive(s) 16. In some examples, the fan guard 100 can be provided in addition to the finger guard 40. In some examples, the fan guard 100 can be provided in place of the finger guard 40 so that no extra part is needed for the computing system 10. In some examples, the fan guard 100 can be coupled to the body 12 of the computing system 10 so that the air flow created by the fan system 18 passes through the fan guard 100. The fan guard 100 can be operable to dampen and/or attenuate acoustic noise from the corresponding fan system 18 and reduce airborne turbulence and airborne acoustic noise.

Figure 2A:
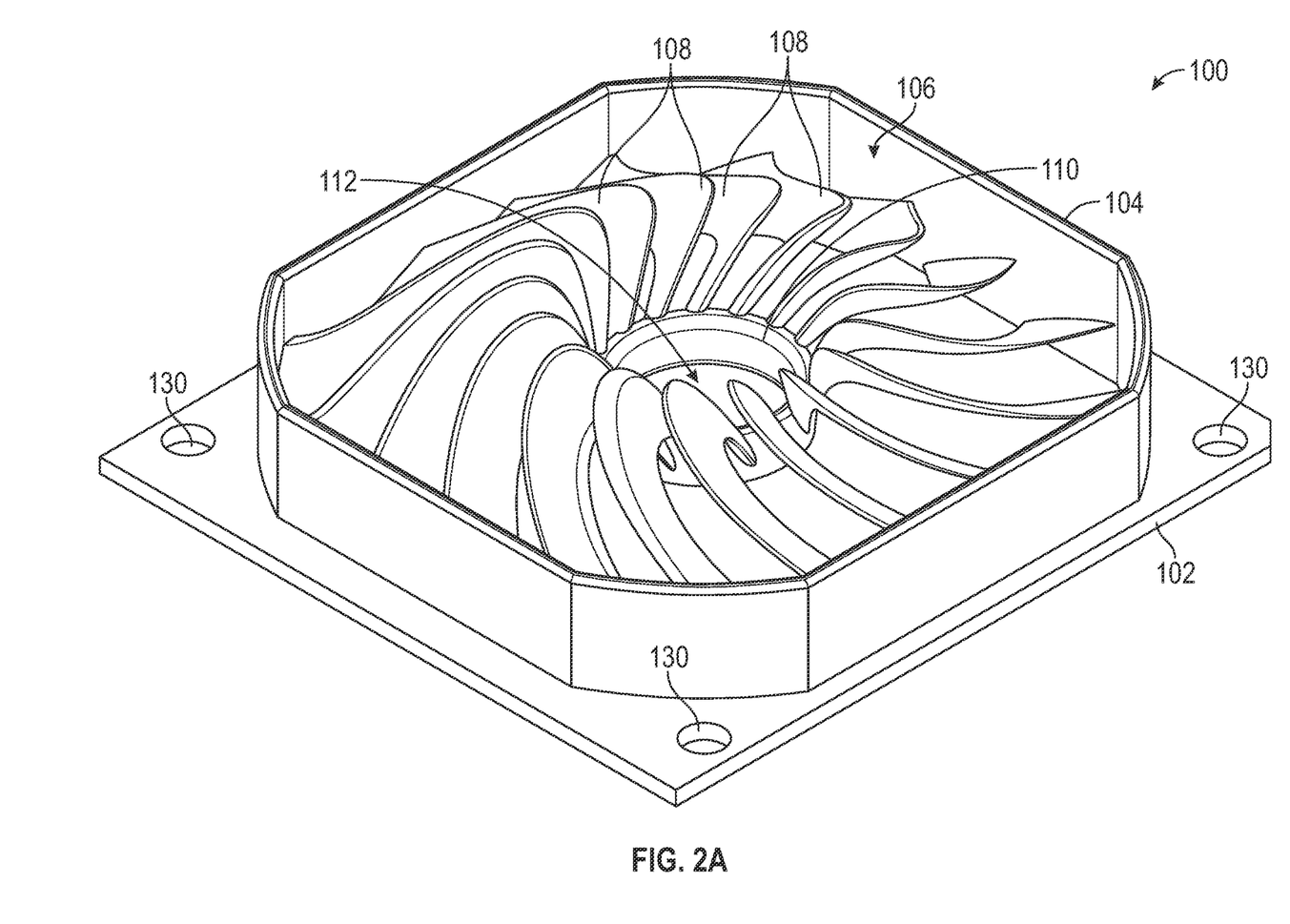
FIG. 2A is a perspective view of a fan guard.
Figure 2B:
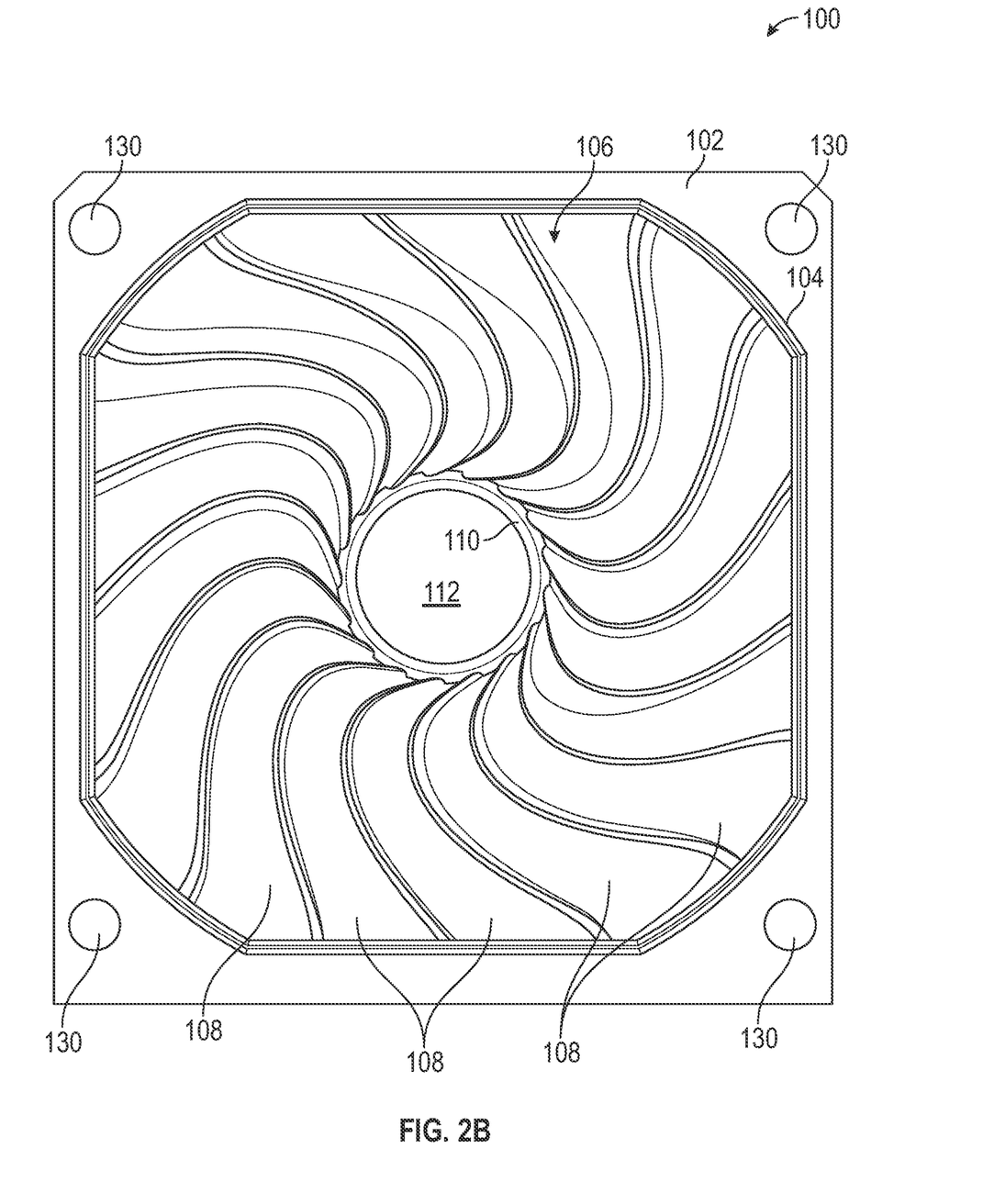
FIG. 2B is a front view of the fan guard of FIG. 2A.

As shown in FIGS. 2A and 2B, the fan guard 100 can include a guard housing 102. The guard housing 102 can include a plurality of coupling portions 130 operable to couple the guard housing 102 with the fan system 18 and/or the body 12 of the computing system 10. As illustrated in FIGS. 2A and 2B, the coupling portions 130 can include apertures operable to receive fastening components such as screws.

The guard housing 102 can include an outer tunnel wall 104 which forms a housing aperture 106 to permit air to flow across the guard housing 102. In some examples, the outer tunnel wall 104 can be slanted such that the outer tunnel wall 104 does not extend perpendicularly from the guard housing 102. In some examples, the outer tunnel wall 104 can extend perpendicularly from the guard housing 102. The outer tunnel wall 104 can be configured to maintain laminar air flow across the guard housing 102.

A plurality of guard blades 108 are disposed in the housing aperture 106 such that the air flows across the guard blades 108. As illustrated in FIGS. 2A and 2B, the fan guard 100 can include between 14 and 19 guard blades 108. In some examples, the fan guard 100 can include 17 guard blades 108. Each of the guard blades 108 can be configured to extend from the guard housing 102 towards a center of the housing aperture 106. For example, as illustrated in FIGS. 2A and 2B, the guard blades 108 can extend from the outer tunnel wall 104 towards the center of the housing aperture 106.

In some examples, as illustrated in FIGS. 2A and 2B, the fan guard 100 can include a hollow ring 110 located in the center of the housing aperture 106. The hollow ring 110 can form a center hole 112 through which the air can flow. The guard blades 108 can extend from the outer tunnel wall 104 to the hollow ring 110. The guard blades 108 are connected by the hollow ring 110 for maximum air flow.

As shown in FIGS. 2A and 2B, the guard blades 108 can be configured to at least partially overlap one another. Each one guard blade 108 can at least partially overlap an adjacent guard blade 108. In some examples, the guard blades 108 can overlap the adjacent guard blades 108 by about 0.10 millimeters to about 0.15 millimeters. In some examples, the guard blades 108 can overlap the adjacent guard blades 108 by about 0.13 millimeters. By overlapping one another, the guard blades 108 can be operable to reduce or block acoustic noise from the fan system 108.

Each of the guard blades 108 can have be sigmoid curved and twisted to provide the desired shape to sufficiently reduce noise and energy usage by the computing system 10, and to provide maximum air flow to maintain the temperatures of the hard drives 106 within the computing system 10.

Figure 3A:
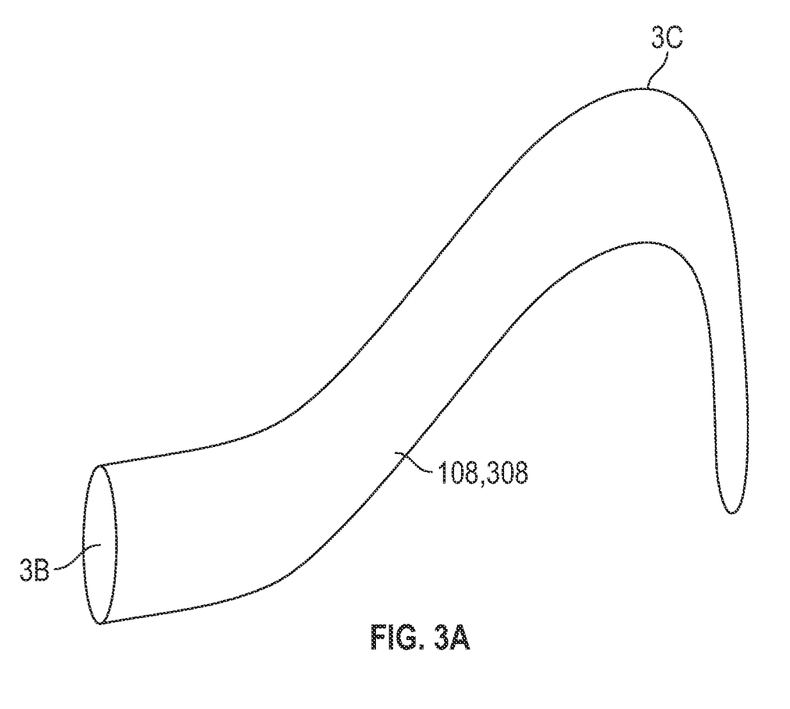
FIG. 3A is a perspective view of a fan blade prior to twisting.
Figure 3B:
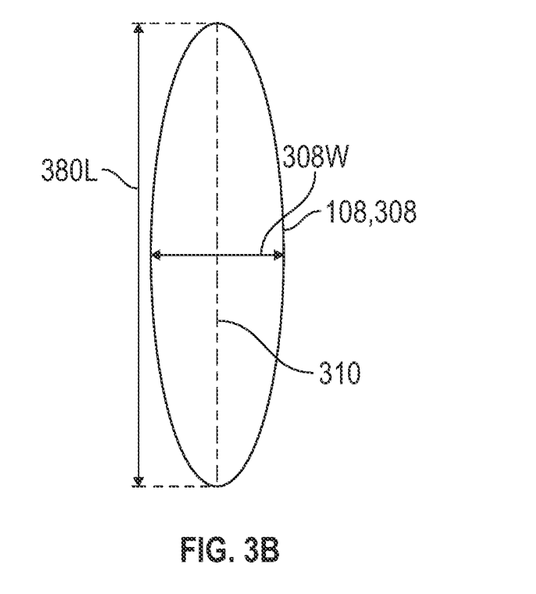
FIG. 3B is a cross-sectional view of the fan blade of FIG. 3A prior to twisting.
Figure 3C:
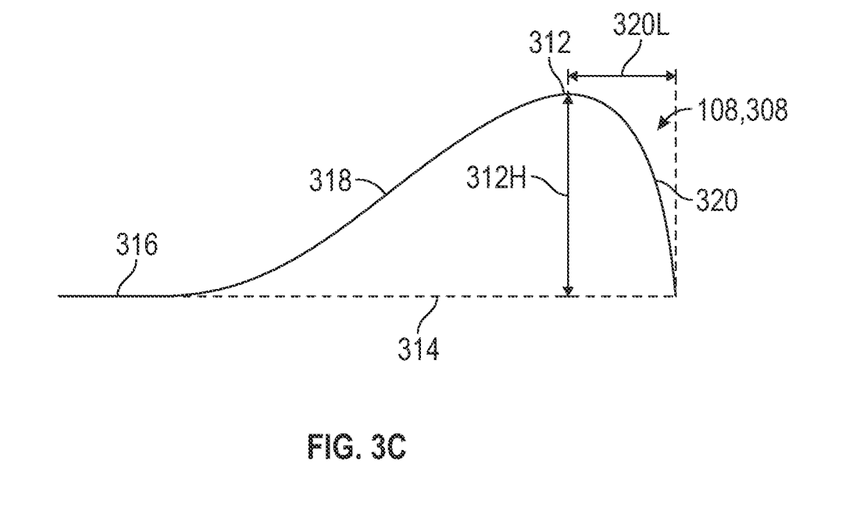
FIG. 3C shows a curvature of a side view of the fan blade prior to twisting.

FIGS. 3A, 3B, and 3C illustrate a guard blade 108, 308 before being twisted by a twist angle. As shown in FIG. 3A, the guard blade 308 before being twisted has a cross-sectional elliptical shape 3B which is illustrated in FIG. 3B. Also, the guard blade 308 has a curvature 3C which is illustrated in FIG. 3C. The curvature 3C as shown in FIG. 3C is from a side view of the guard blade 308 before being twisted. As shown in FIG. 3B, the cross-sectional shape of the guard blade 308 before being twisted can have substantially an elliptical shape. The cross-section of the guard blade 308 before being twisted can be substantially symmetrical such that both sides of the cross-section of the guard blade 308 are mirrored one another in reference to a center line 310. A length 380L of the cross-section of the guard blade 308 can be between about 5 millimeters and about 10 millimeters. In some examples, the length 380L can be about 7 millimeters. A width 380W of the cross-section of the guard blade 308 can be between about 1 millimeter and about 3 millimeters. In some examples, the width 380W can be about 2 millimeters. After the guard blade 308 is twisted to be guard blade 108, the cross-sectional dimensions and shape may change.

FIG. 3C illustrates a curvature of the guard blade 308 before twisting that can be shown from a side view of the guard blade 308. As shown in FIG. 3C, the guard blade 308 can be sigmoid curved to have a droplet shape. The guard blade 308 can be curved between an apex 312 and a base plane 314. A height difference 312H between the apex 312 and the base plane 314 can be between about 10 millimeters to about 15 millimeters. In some examples, the height difference 312H between the apex 312 and the base plane 314 can be about 13 millimeters. The guard blade 308 can include a base portion 316 that is substantially in line with the base plane 314, a rising portion 318 that curves from the base portion 316 to the apex 312, and a falling portion 320 that curves from the apex back down to the base plane 314. The curvature of the rising portion 318 can be opposite the curvature of the falling portion 320. A distance 320L between the apex 312 and the end of the guard blade 308 (e.g., end of the falling portion 320 of the guard blade 308) can be between about 5 millimeters and about 10 millimeters. In some examples, the distance 320L can be between about 7 millimeters and about 8 millimeters. In some examples, the distance 320L can be about 7.56 millimeters.

Figure 4A:
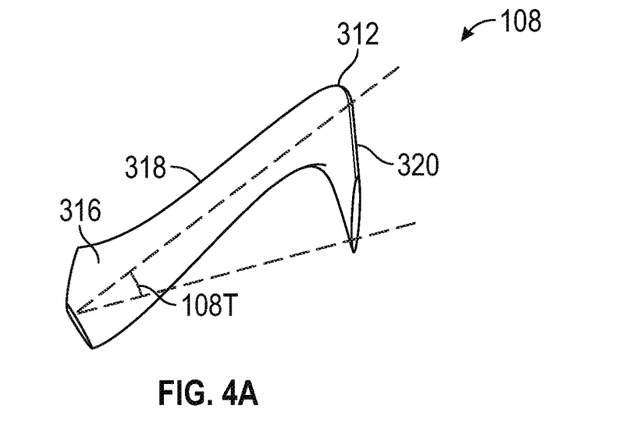
FIGS. 4A, 4B, and 4C are different views of the fan blade after being twisted.
Figure 4B:
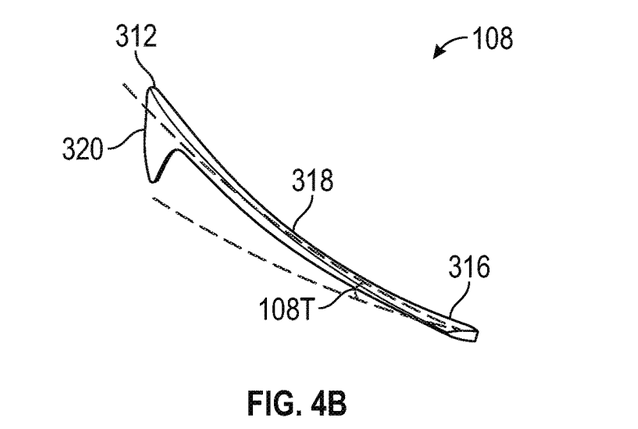
Figure 4C:
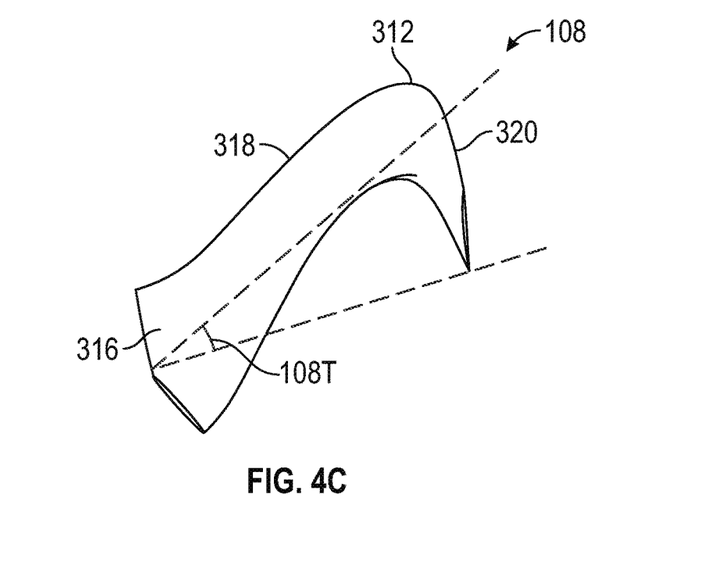

The guard blade 108 can have a cross-section that is substantially an elliptical shape and have a sigmoid curve that is twisted by a twist angle 108T. FIGS. 4A-4C illustrate the guard blade 108 after being twisted by the twist angle 108T. In some examples, the twist angle 108T can be between about 50 degrees and about 60 degrees. In some examples, the twist angle 108T can be about 55 degrees.

By having a shape that is a sigmoid curve being flexed (e.g., twisted), the guard blades 108 can reduce bypassed air turbulence in order to block acoustic noise from the fan systems 108 and reduce and/or attenuate airborne acoustic noise.

Figure 5:
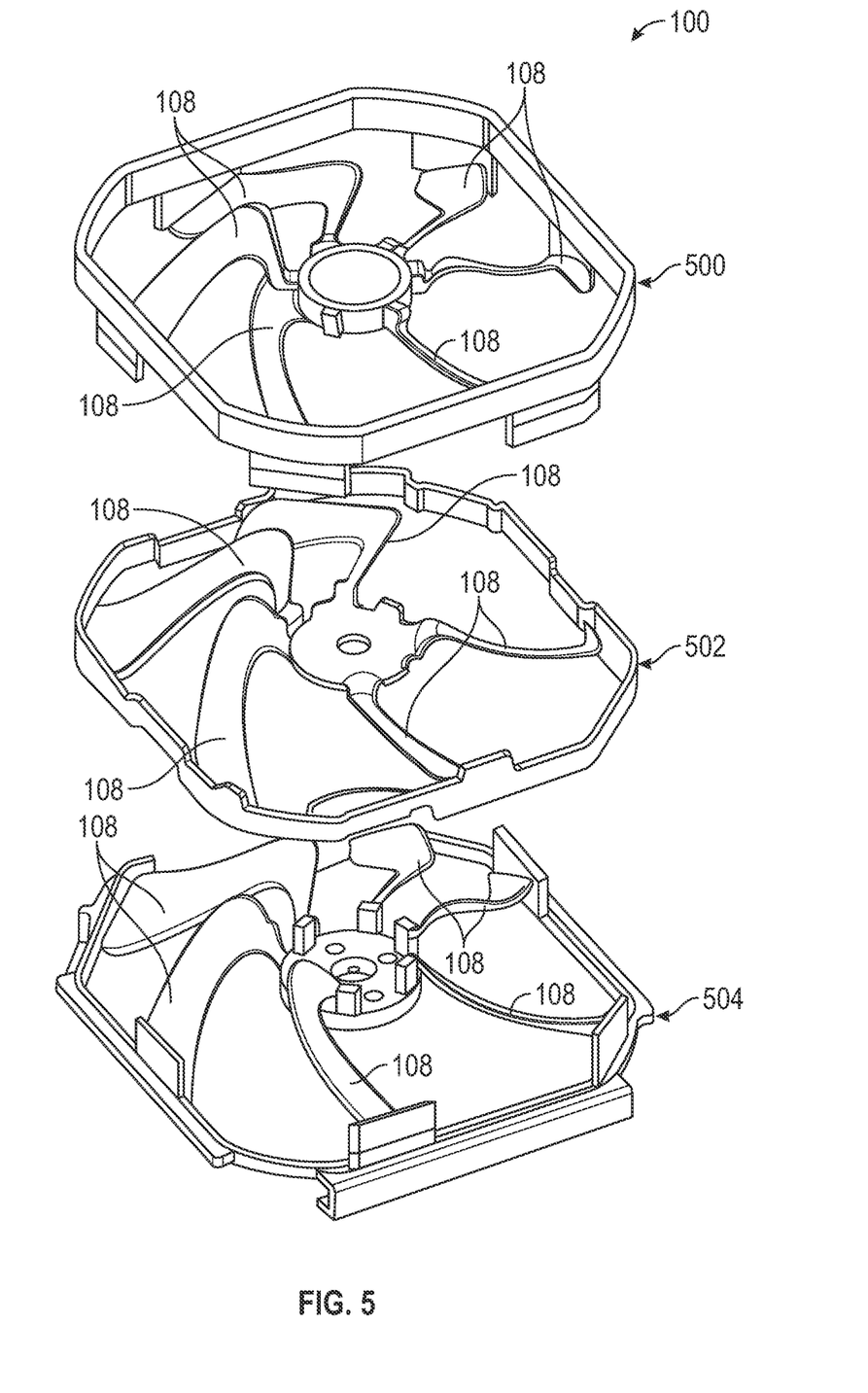
FIG. 5 is a perspective, exploded view of the fan guard.

FIG. 5 illustrates an exploded view of the fan guard 100, for example during manufacturing. As the fan guard 100 can include seventeen guard blades 108 that partially overlap, the fan guard 100 can be manufactured in three portions—a lower portion 504, a middle portion 502, and a top portion 500. Each of the three portions 500, 502, 504 can include a number of the guard blades 108 such that when the three portions 500, 502, 504 are combined, the fan guard 100 provides seventeen guard blades 108 that partially overlap. The three portions 500, 502, 504 can be configured to nest. As illustrated in FIG. 5, the top portion 500 can include six guard blades 108, the middle portion 502 can include five guard blades, and the bottom portion 504 can include six guard blades 108.

Figure 6A:
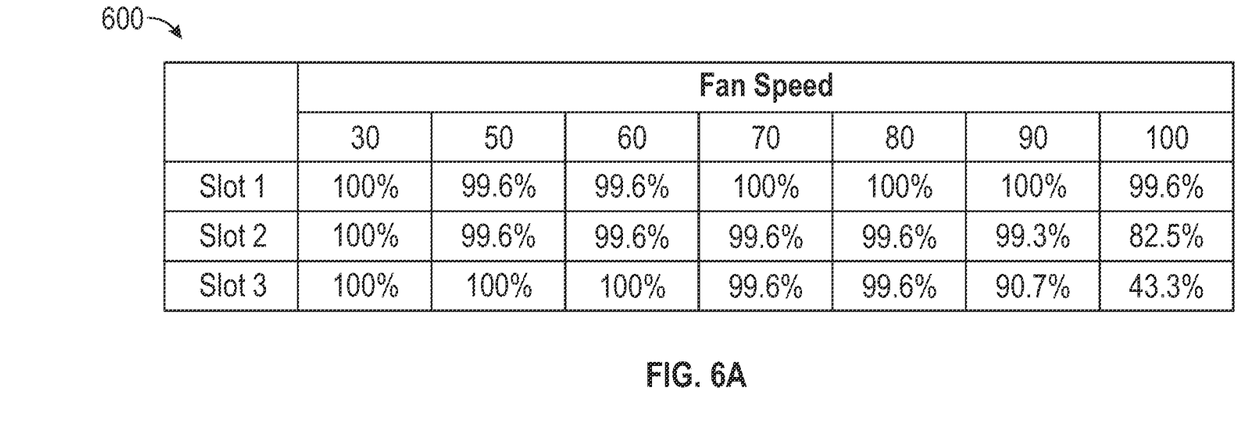
FIG. 6A is a table showing hard drive performance corresponding with different fan speeds with a conventional fan guard.
Figure 6B:
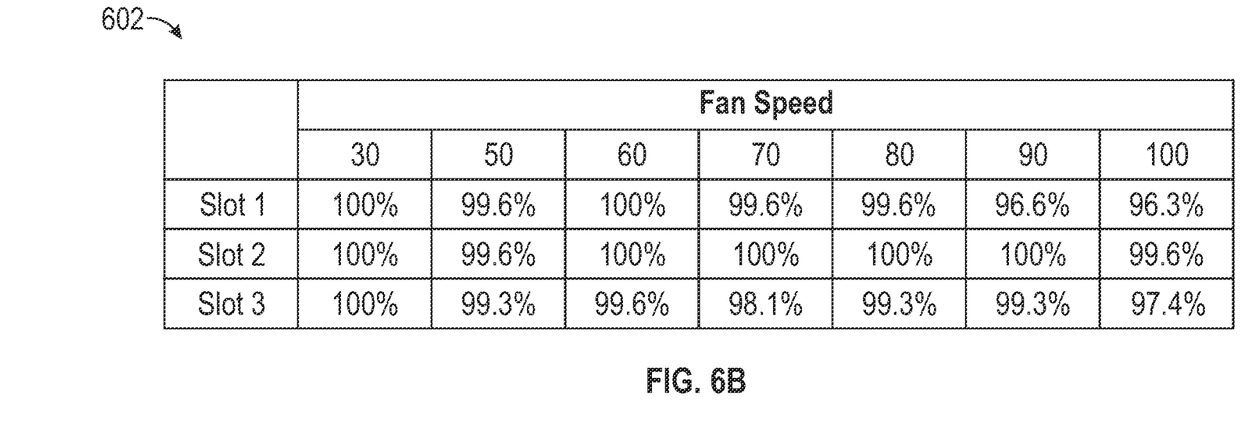
FIG. 6B is a table showing hard drive performance corresponding with different fan speeds with the fan guard disclosed herein.

FIG. 6A is a table 600 showing hard drive performance corresponding with different fan speeds with a conventional fan and finger guard. FIG. 6B is a table 602 showing hard drive performance corresponding with different fan speeds with the fan guard 100. Notably, as shown in FIG. 6A, the last two rows (e.g., slots 2 and 3) of hard drives 106 in conventional computing systems at fan speed 100 have large degradation due to the high power, noise, and rotations per minute from the fan system 108. However, as shown in FIG. 6B, by including the fan guard 100 as disclosed herein, the last two rows of hard drives 106 increased in performance.

Figure 7:
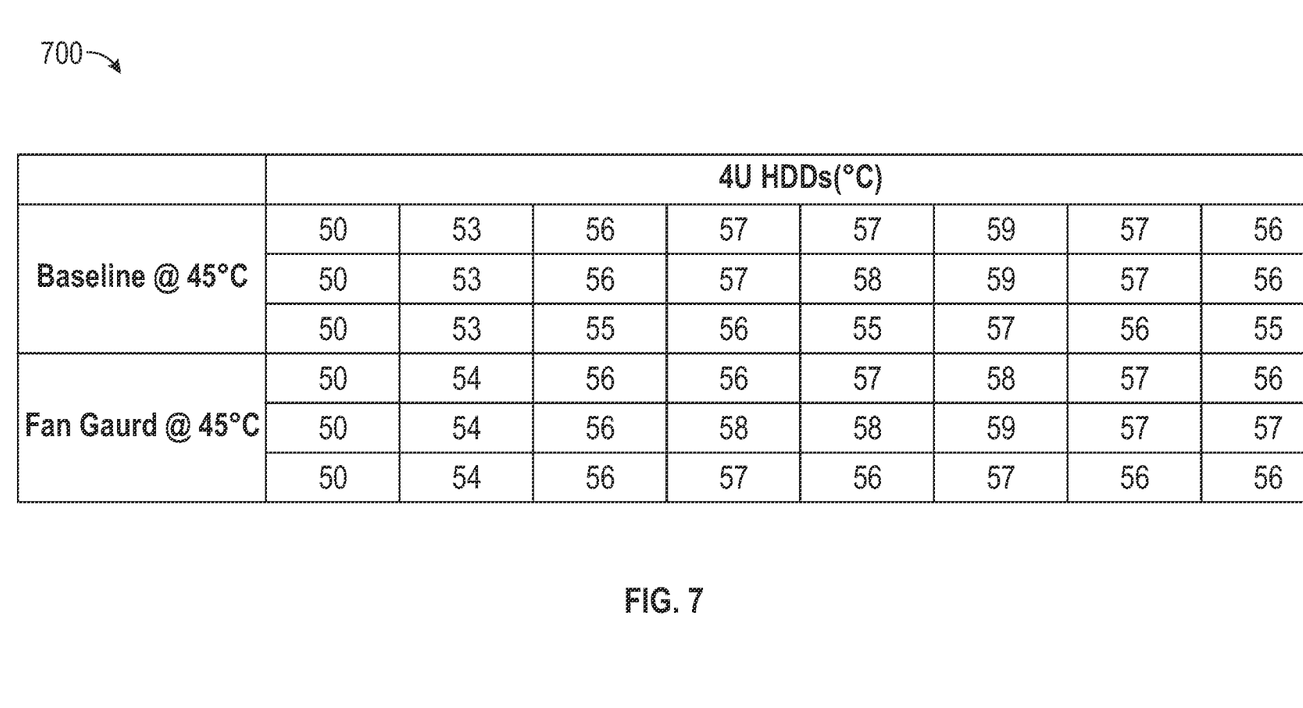
FIG. 7 is a table showing a comparison of temperatures of hard drives between a conventional fan guard and the fan guard disclosed herein.

FIG. 7 is a table 700 showing a comparison of temperatures of hard drives 106 between a conventional fan guard and the fan guard 100. Hard drives 106 for computing systems 10 such as modular servers and/or information handling systems must remain under 60 degrees Celsius. As can be seen in FIG. 7, the inclusion of the fan guard 100 does not affect the temperatures of the hard drives 106, as the hard drives 106 are all performing under 60 degrees Celsius.

Figure 8:
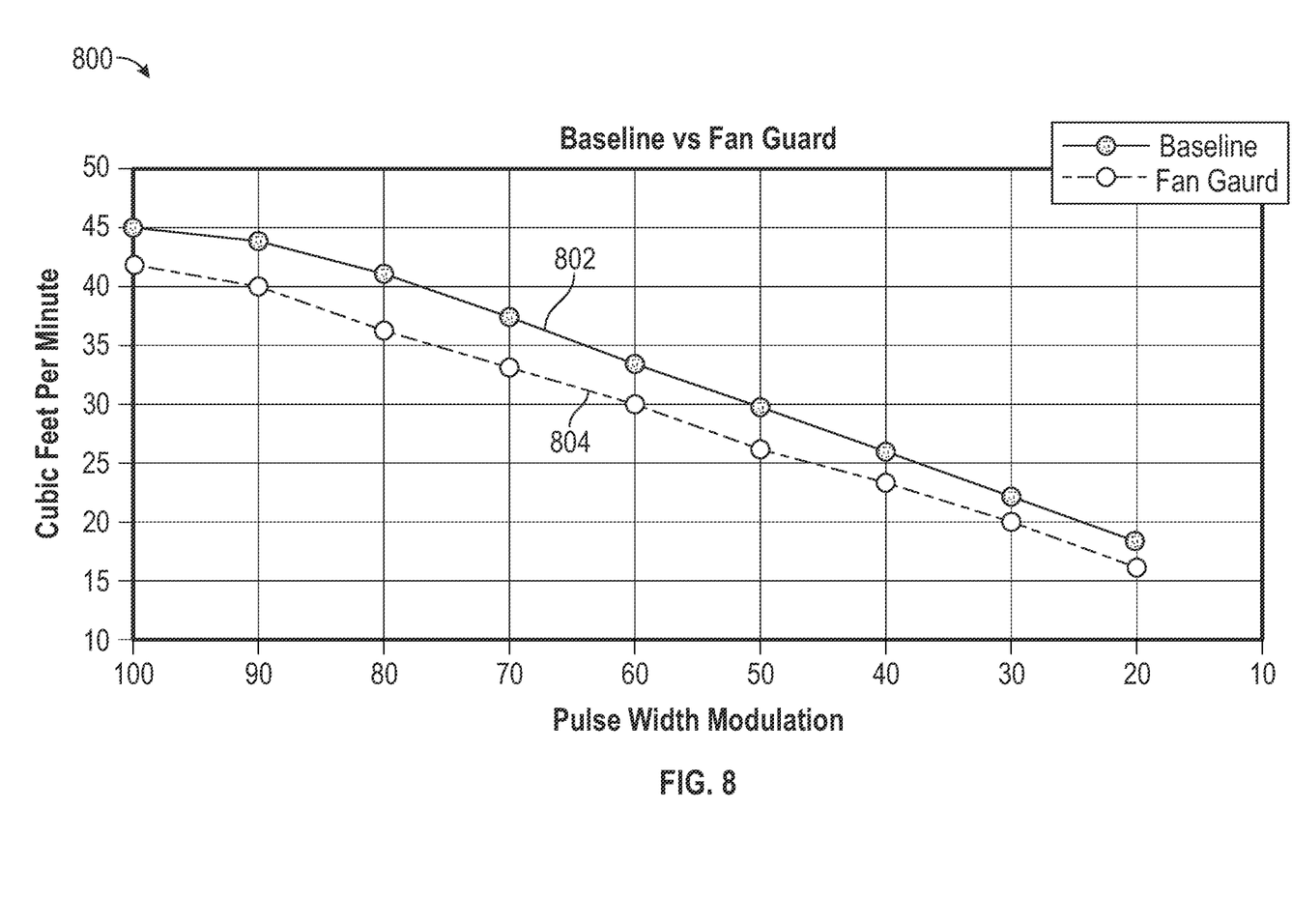
FIG. 8 is a graph showing a comparison of pulse width modulation versus air flow in cubic feet per minute between a conventional fan guard and the fan guard disclosed herein.

FIG. 8 is a graph showing a comparison of pulse width modulation of the fan system versus air flow in cubic feet per minute between a conventional fan guard as line 802 and the fan guard 100 as line 804. As shown in FIG. 8, the air flow when including the fan guard 100 is not impacted statistically significantly in comparison to the baseline 802. Accordingly, the fan guard 100 provides the benefits of increased fan speed, less noise, and less air turbulence while maintaining the efficiency and performance of the computing system 10.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure to the full extent indicated by the broad general meaning of the terms used in the attached claims. It will therefore be appreciated that the embodiments described above may be modified within the scope of the appended claims.

What is claimed is:

1. A fan guard comprising:
   a guard housing including an outer tunnel wall forming a housing aperture to permit air to flow across the guard housing;
   a plurality of guard blades disposed in the housing aperture, each of the plurality of guard blades extending from the guard housing towards a center of the housing aperture,
   wherein each guard blade of the plurality of guard blades at least partially overlaps an adjacent guard blade of the plurality of guard blades, wherein each of the plurality of guard blades is sigmoid curved such that the plurality of guard blades each have compound curves in two opposing directions.

2. The fan guard of claim 1, further comprising a hollow ring located in the center of the housing aperture, wherein the plurality of guard blades extend from the outer tunnel wall to the hollow ring.

3. The fan guard of claim 1, wherein each of the plurality of guard blades is curved between an apex and a base plane, wherein a height difference between the apex and the base plane is between 10 millimeters to 15 millimeters.

4. The fan guard of claim 1, wherein each of the plurality of guard blades is twisted by a twist angle.

5. The fan guard of claim 4, wherein the twist angle is between 50 degrees and 60 degrees.

6. The fan guard of claim 4, wherein the twist angle is 55 degrees.

7. The fan guard of claim 1, wherein each guard blade overlaps the adjacent guard blade by 0.10 millimeters to 0.15 millimeters.

8. The fan guard of claim 1, wherein the plurality of guard blades includes seventeen guard blades.

9. A fan system comprising:
a housing;
a plurality of fan blades disposed in the housing, the plurality of fan blades operable to rotate to create air flow;
a fan guard coupled to the housing, the fan guard including:
a guard housing including an outer tunnel wall forming a housing aperture to permit air to flow across the guard housing;
a plurality of guard blades disposed in the housing aperture, each of the plurality of guard blades extending from the guard housing towards a center of the housing aperture,
wherein each guard blade of the plurality of guard blades at least partially overlaps an adjacent guard blade of the plurality of guard blades,
wherein each of the plurality of guard blades is sigmoid curved such that the plurality of guard blades each have compound curves in two opposing directions.

10. The fan system of claim 9, wherein the fan guard includes a hollow ring located in the center of the housing aperture, wherein the plurality of guard blades extend from the outer tunnel wall to the hollow ring.

11. The fan system of claim 9, wherein each of the plurality of guard blades is curved between an apex and a base plane, wherein a height difference between the apex and the base plane is between 10 millimeters to 15 millimeters.

12. The fan system of claim 9, wherein each of the plurality of guard blades is twisted by a twist angle.

13. The fan system of claim 12, wherein the twist angle is between 50 degrees and 60 degrees.

14. The fan system of claim 12, wherein the twist angle is 55 degrees.

15. The fan system of claim 9, wherein each guard blade overlaps the adjacent guard blade by 0.10 millimeters to 0.15 millimeters.

16. The fan system of claim 9, wherein the plurality of guard blades includes seventeen guard blades.

17. A computing system comprising:
a body;
one or more hard drives disposed in the body;
a fan system including:
a housing;
a plurality of fan blades disposed in the housing, the plurality of fan blades operable to rotate to create air flow through the body;
a fan guard coupled to the housing, the fan guard including:
a guard housing including an outer tunnel wall forming a housing aperture to permit air to flow across the guard housing;
a plurality of guard blades disposed in the housing aperture, each of the plurality of guard blades extending from the guard housing towards a center of the housing aperture,
wherein each guard blade of the plurality of guard blades at least partially overlaps an adjacent guard blade of the plurality of guard blades,
wherein each of the plurality of guard blades is sigmoid curved such that the plurality of guard blades each have compound curves in two opposing directions.

18. The computing system of claim 17, wherein the fan guard includes a hollow ring located in the center of the housing aperture, wherein the plurality of guard blades extend from the outer tunnel wall to the hollow ring, wherein each of the plurality of guard blades is curved between an apex and a base plane, wherein a height difference between the apex and the base plane is between 10 millimeters to 15 millimeters, wherein each of the plurality of guard blades is twisted by a twist angle between 50 degrees and 60 degrees.

* * * * *